(12) United States Patent
Liu et al.

(10) Patent No.: US 11,622,483 B2
(45) Date of Patent: Apr. 4, 2023

(54) GRADIENT ELECTRICALLY CONDUCTIVE-UNIFORM THERMALLY CONDUCTIVE DUAL NETWORK STRUCTURE-BASED ELECTROMAGNETIC SHIELDING POLYMER COMPOSITE WITH LOW REFLECTION AND HIGH ABSORPTION

(71) Applicants: NORTH UNIVERSITY OF CHINA, Taiyuan (CN); SHANXI ZHONGBEI NEW MATERIAL TECHNOLOGY CO., LTD., Taiyuan (CN)

(72) Inventors: Yaqing Liu, Taiyuan (CN); Hongji Duan, Taiyuan (CN); Guizhe Zhao, Taiyuan (CN)

(73) Assignees: NORTH UNIVERSITY OF CHINA, Taiyuan (CN); SHANXI ZHONGBEI NEW MATERIAL TECHNOLOGY CO., LTD., Taiyuan (CN)

( * ) Notice: Subject to any disclaimer, the term of this patent is extended or adjusted under 35 U.S.C. 154(b) by 0 days.

(21) Appl. No.: 17/540,584

(22) Filed: Dec. 2, 2021

(65) Prior Publication Data
US 2022/0095498 A1 Mar. 24, 2022

(51) Int. Cl.
*H05K 9/00* (2006.01)
*C08K 3/04* (2006.01)
(Continued)

(52) U.S. Cl.
CPC .......... *H05K 9/0088* (2013.01); *B29C 39/006* (2013.01); *C08K 3/041* (2017.05); *C08K 3/38* (2013.01); *C08K 9/00* (2013.01); *C08L 75/04* (2013.01); *C08L 83/06* (2013.01); *H05K 9/009* (2013.01); *B29K 2075/00* (2013.01);
(Continued)

(58) Field of Classification Search
CPC .......... H05K 9/009; C08K 3/041; C08K 3/38
See application file for complete search history.

(56) References Cited

U.S. PATENT DOCUMENTS 10,941,464 B1 * 3/2021 Agarwal ................. B22D 27/00
2016/0301377 A1 * 10/2016 Li ......................... H03H 7/0115
(Continued)

FOREIGN PATENT DOCUMENTS

| CN | 111391440 A | 7/2020 |
| CN | 112080137 A | 12/2020 |

*Primary Examiner* — Hung V Ngo

(57) ABSTRACT

A gradient electrically conductive-uniform thermally conductive dual network structure-based electromagnetic shielding polymer composite with low reflection and high absorption and a preparation method thereof. The electromagnetic shielding polymer composite includes a gradient conductive carbon nanotube network with a vertically oriented cell structure and a uniformly thermally conductive hexagonal boron nitride/carbon nanotube network constructed by the hexagonal boron nitride dispersed uniformly in the carbon nanotube network and the gradient carbon nanotube network. The gradient electrically conductive carbon nanotube network and the uniformly thermally conductive hexagonal boron nitride/carbon nanotube network form a composite synergistic dual function network structure so as to make the electromagnetic shielding polymer composite have a low reflection and high absorption and excellent thermal conductivity.

9 Claims, 5 Drawing Sheets

(51) Int. Cl.
*C08K 3/38* (2006.01)
*B29C 39/00* (2006.01)
*C08K 9/00* (2006.01)
*C08L 75/04* (2006.01)
*C08L 83/06* (2006.01)
*B29K 75/00* (2006.01)
*B29K 83/00* (2006.01)
*B82Y 30/00* (2011.01)
*B82Y 40/00* (2011.01)

(52) U.S. Cl.
CPC ........... *B29K 2083/00* (2013.01); *B82Y 30/00* (2013.01); *B82Y 40/00* (2013.01); *C08K 2003/385* (2013.01); *C08K 2201/001* (2013.01)

(56) References Cited

U.S. PATENT DOCUMENTS

| | | | |
|---|---|---|---|
| 2017/0253485 A2* | 9/2017 | Kim | ................. H04L 41/22 |
| 2022/0274887 A1* | 9/2022 | Erb | ................. B32B 18/00 |

* cited by examiner

GRADIENT ELECTRICALLY CONDUCTIVE-UNIFORM THERMALLY CONDUCTIVE DUAL NETWORK STRUCTURE-BASED ELECTROMAGNETIC SHIELDING POLYMER COMPOSITE WITH LOW REFLECTION AND HIGH ABSORPTION

CROSS-REFERENCE TO RELATED APPLICATIONS

This application claims the benefit of priority from Chinese Patent Application No. 202110203798.X, filed on Feb. 23, 2021. The content of the aforementioned application, including any intervening amendments thereto, is incorporated herein by reference in its entirety.

TECHNICAL FIELD

This application relates to functional polymer composites, and more specifically to a gradient electrically conductive-uniform thermally conductive dual network structure-based electromagnetic shielding polymer composite with low reflection and high absorption.

BACKGROUND

The rapid development of the intelligent electronics industry benefits from the emergence of a 5G mobile communication technology. However, at the same time, the increasingly-complex electromagnetic radiation has become one of the main factors that affect the accuracy of the equipment and threaten human health. Therefore, it is urgent to develop a new and efficient shielding material to meet the increasing requirements for electromagnetic radiation protection. It has been reported that high conductivity and a multi-interface structure control play vital roles in preparing a composite with high shielding effectiveness. However, with respect to an ideal shielding material, just having high conductivity is not enough because the high conductivity often directly causes serious reflection when an electromagnetic wave is transmitted to the surface of a material due to the impedance mismatch, which will cause secondary pollution. Therefore, it has become a current research hotspot to develop a new green electromagnetic shielding material through multi-interface structure control.

Researches have demonstrated that the multi-interface characteristic of a gradient conductive network can impart low reflection and high absorption to an electromagnetic shielding material so that an incident electromagnetic wave will be lost in the form of heat inside the electromagnetic shielding material. However, low thermal conductivity and abundant phonon scattering interfaces of polymer-based electromagnetic shielding material will significantly affect the overall thermal conductivity, which will cause heat accumulation in the material, affecting the regular use of the polymer-based electromagnetic shielding material and affecting a normal operation and service life of an instrument protected thereby. Therefore, it is necessary to find an effective technical means to build a gradient electric conduction-uniform insulating thermal conduction dual network in the polymer substrate to simultaneously realize an effective control of the balance between absorption and reflection and the balance between heat generation-heat conduction of the electromagnetic shielding material.

SUMMARY

An object of this application is to provide a method for effectively constructing a gradient electrically conductive-insulating thermally conductive dual network in a polymer composite so as to prepare a high-efficiency electromagnetic shielding composite with low reflection, high absorption and optimized thermal conductivity.

The technical solutions of the present disclosure are described as follows.

In a first aspect, the disclosure provides a gradient electrically conductive-uniform thermally conductive dual network structure-based electromagnetic shielding polymer composite with low reflection and high absorption, comprising:

a gradient conductive carbon nanotube (CNT) network with a vertically oriented cell structure; and a uniform thermally conductive hexagonal boron nitride/carbon nanotube network constructed by a hexagonal boron nitride (hBN) dispersed uniformly in the carbon nanotube network and the gradient carbon nanotube network;

wherein the gradient electrically conductive carbon nanotube network and the uniform thermally conductive hexagonal boron nitride/carbon nanotube network form a composite synergistic dual function network structure so as to make the electromagnetic shielding polymer composite have a low reflection and high absorption to the electromagnetic wave and excellent thermal conductivity.

The gradient conductive carbon nanotube foam is used as a conductive framework for the layer-by-layer capture and attenuation of the electromagnetic wave and also as an effective medium for phonon transmission. Simultaneously, the hexagonal boron nitride with high thermal conductivity is vertically filled in the polymer composite as a channel for the phonon transmission, realizing the optimization of the thermal conductivity of the polymer composite. The disclosure successfully combines the gradient conductive carbon nanotube foam with the insulating and thermal conductive boron nitride. The low reflection and high absorption of the electromagnetic shielding polymer composite are reached by means of a prefabricated gradient conductive network structure; and at the same time, the gradient conductive network structure is prefabricated to have an oriented cell structure to enable the oriented arrangement of the hexagonal boron nitride under an effect of volume limitation, so as to achieve the optimization of thermal conductivity of the composite. Consequently, an electromagnetic shielding polymer composite with low reflection, high absorption and optimized thermal conductivity is finally obtained.

In a second aspect, the disclosure also provides a method for preparing the gradient electrically conductive-uniform thermally conductive dual network structure-based electromagnetic shielding polymer composite, comprising:

(S1) blending different portions of a carbon nanotube respectively with a waterborne polyurethane (WPU) in deionized water followed by ultrasonic dispersion to obtain multiple dispersions with different carbon nanotube contents; and pouring the multiple dispersions with different carbon nanotube contents into a mould in an order of carbon nanotube content from large to small or from small to large, followed by freeze shaping in liquid nitrogen and heat flow-assisted interface elimination to make cells communicated to obtain a multi-layer conductive carbon nanotube foam;

(S2) subjecting hexagonal boron nitride particles to ball milling to reduce the number of layers and a sheet size to obtain a hexagonal boron nitride with a desired average sheet size;

(S3) mixing the hexagonal boron nitride prepared in step (S2) with a silicone rubber followed by ultrasonic dispersion and stirring; and adding a curing agent followed by uniform mixing and deaeration in a vacuum oven to obtain a uniformly-dispersed silicone rubber/hexagonal boron nitride mixture; and (S4) pouring the silicone rubber/hexagonal boron nitride mixture prepared in step (S3) into the mould containing the multi-layer conductive carbon nanotube foam prepared in step (S1) by a vacuum potting until the silicone rubber/hexagonal boron nitride mixture is filled into the multi-layer conductive carbon nanotube foam completely to produce a crude composite; and curing the crude composite to obtain the gradient electrically conductive-uniform thermally conductive dual network structure-based electromagnetic shielding polymer composite with low reflection and high absorption.

In the preparation method provided herein, the dispersions with different carbon nanotube contents are quickly freeze-shaped layer by layer, and after the dispersions with gradient carbon nanotube contents are entirely frozen, water is removed to obtain a gradient conductive carbon nanotube foam with an oriented cell structure. The hexagonal boron nitride and the silicone rubber are uniformly blended and then filled into the gradient carbon nanotube foam by pouring and curing to obtain a gradient carbon nanotube-based electromagnetic shielding polymer composite. The present disclosure first prefabricates a conductive network and then combines a multi-layer gradient conductive carbon nanotube with the boron nitride, which has the high thermal conductivity but is insulating, to produce an electromagnetic shielding polymer composite with low reflection and high absorption and optimized thermal conductivity. On the one hand, the carbon nanotube foam with a gradient structure can reduce the impedance mismatch between the material surface and air so that the electromagnetic wave can enter the material as much as possible, and then the internal multi-layer gradient structure can attenuate the electromagnetic wave layer by layer, thereby capturing the electromagnetic wave to the greatest extent. On the other hand, the oriented cell structure of a prefabricated network can make the hexagonal boron nitride with high thermal conductivity be more effectively connected in a vertical cell through the volume limitation, thereby ensuring the optimization of the thermal conductivity of the electromagnetic shielding polymer composite, and finally obtaining a gradient carbon nanotube-based thermal-conductive electromagnetic shielding polymer composite with low reflection and high absorption.

In an embodiment, in step (S2), the hexagonal boron nitride obtained from the ball milling has an average sheet size of 1 μm, a density of 2.27 g/cm$^3$ and an in-plane thermal conductivity of 600 Wm$^{-1}$K$^{-1}$.

In an embodiment, in step (S3), a weight ratio of the silicone rubber to the curing agent is 1:1, and a density of the silicone rubber is 1.1 g/cm$^3$.

In an embodiment, in step (S4), the curing is performed at 80° C. for 2 h.

In an embodiment, in step (S1), a carbon nanotube content of the multi-layer conductive carbon nanotube foam is 10-40 wt %; and a solid content of the multiple dispersions is 20 g/L.

In an embodiment, in step (S3), a weight ratio of the hexagonal boron nitride to the silicone rubber is (2-5):10.

In an embodiment, the gradient electrically conductive-uniform thermally conductive electromagnetic shielding polymer composite comprises 10%-20% by weight of the hexagonal boron nitride and 4.8%-5.7% by weight of the multi-layer conductive carbon nanotube foam.

In an embodiment, in step (S1), the waterborne polyurethane has a density of 0.95 g/cm$^3$ and a solid content of 35 wt %.

In an embodiment, before pouring silicone rubber/hexagonal boron nitride mixture, the freeze-shaped carbon nanotube sample is treated by the heat flow.

Compared to the prior art, the present disclosure has the following beneficial effects.

In the carbon nanotube-based electromagnetic shielding polymer composite prepared herein, a gradient conductive carbon nanotube foam prepared by heat flow-assisted layer-by-layer freezing is used as a conductive framework to capture and attenuate the electromagnetic wave and also as an effective medium for the phonon transmission. The unique heat flow-assisted freezing process helps eliminate an interface between conductive layers and obtain a unique multi-layer structure with the oriented and connected cells. This special structure facilitates the communication of the hexagonal boron nitride in the composite, to weaken the phonon scattering significantly at the interface. Subsequently, the silicon rubber/hexagonal boron nitride mixture is filled into the oriented cells of the gradient conductive carbon nanotube foam by pouring to form a tightly-connected thermal conductive network in the cells, optimizing the thermal conductivity of the carbon nanotube-based electromagnetic shielding polymer composite. By combining the electrically conductive gradient carbon nanotube foam and the insulating and thermal conductive hexagonal boron nitride, the disclosure realizes the preparation of an electromagnetic shielding composite with low reflection and high absorption and optimized thermal conductivity.

Figure 1:
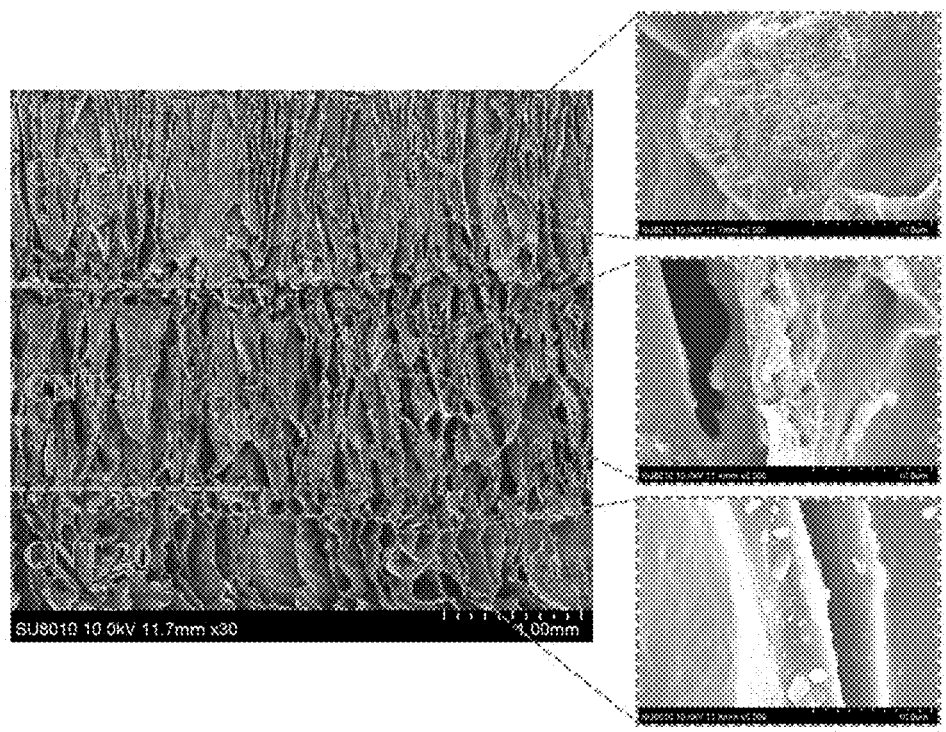
FIG. 1 is a scanning electron microscopy (SEM) image of a cross-section of a gradient conductive carbon nanotube foam according to an embodiment of the present disclosure.

Note: in all Figures, the letters n, m and k in nCNT, n-mCNT and n-m-kCNT represent the mass fraction of CNT from top to bottom in turn. The letter r in rhBN indicates the mass fraction of hBN in the polymer composite.

DETAILED DESCRIPTION OF EXAMPLES

The present disclosure will be described thoroughly and clearly below with reference to the embodiments.

EXAMPLE 1

Provided herein was a method for preparing a double-layer carbon nanotube-based electromagnetic shielding polymer composite with a gradient electrically conductive-uniform thermally conductive dual network structure, which was specifically described as follows.

(S1) Preparation of a Double-Layer Gradient Conductive Carbon Nanotube Foam 60 mg of a carbon nanotube and 0.69 g of a waterborne polyurethane (with a solid content of 35 wt %) were blended in 15 mL of deionized water and then ultrasonically dispersed for 30 min to obtain a CNT-20 dispersion. 120 mg of the carbon nanotube and 0.51 g of the waterborne polyurethane were blended in 15 mL of deionized water and ultrasonically dispersed for 30 min to obtain a CNT-40 dispersion. The CNT-20 dispersion and the CNT-40 dispersion were poured into a mould in sequence, freeze-shaped in liquid nitrogen, treated by heat flow to eliminate an interface between layers to make the cells communicated, and then subjected to vacuum freeze-drying to obtain the double-layer gradient conductive carbon nanotube foam with a thickness of 4 mm.

(S2) Pre-Treatment of a Hexagonal Boron Nitride

Hexagonal boron nitride particles were ball-milled for 24 h to reduce the number of layers and the sheet size to obtain the hexagonal boron nitride with an average sheet size of 1 μm.

(S3) Preparation of a Silicone Rubber/Hexagonal Boron Nitride Mixture 1 g of hexagonal boron nitride prepared in step (S2) and 4.5 g of silicone rubber polydimethylsiloxane (PDMS) were blended, ultrasonically dispersed, stirred for 10 min, added with 4.5 g of the curing agent, stirred for another 5 min and deaerated in a vacuum oven for 10 min to obtain the uniformly dispersed PDMS/hexagonal boron nitride mixture, where the weight ratio of the silicone rubber PDMS to the curing agent was 1:1.

(S4) Preparation of a gradient electrically conductive-uniform thermally conductive dual network structure-based electromagnetic shielding polymer composite material with low reflection and high absorption. The PDMS/hexagonal boron nitride mixture prepared in step (S3) was poured into the mould containing the double-layer gradient conductive carbon nanotube foam prepared in step (S1) and filled into the carbon nanotube foam under vacuum to obtain a crude composite. After that, the crude composite was cured at 80° C. for 2 h to obtain the gradient electrically conductive-uniform thermally conductive dual network structure-based electromagnetic shielding polymer composite material with low reflection and high absorption.

EXAMPLE 2

Provided herein was a method for preparing a triple-layer carbon nanotube-based electromagnetic shielding polymer composite with a gradient electrically conductive-uniform thermally conductive dual network structure, which was specifically described as follows.

(S1) Preparation of a Triple-Layer Gradient Conductive Carbon Nanotube Foam 40 mg of a carbon nanotube and 0.46 g of a waterborne polyurethane (with a solid content of 35 wt %) were blended in 10 mL of deionized water and ultrasonically dispersed for 30 min to obtain a CNT-20 dispersion. 60 mg of the carbon nanotube and 0.4 g of the waterborne polyurethane were blended in 10 mL of deionized water and ultrasonically dispersed for 30 min to obtain a CNT-30 dispersion. 80 mg of the carbon nanotube and 0.34 g of the waterborne polyurethane were blended in 10 mL of deionized water and ultrasonically dispersed for 30 min to obtain a CNT-40 dispersion. The CNT-20 dispersion, the CNT-30 dispersion and the CNT-40 dispersion were poured into a mould in sequence, freeze-shaped in liquid nitrogen, treated by heat flow to eliminate an interface between layers to make cells communicated, and then subjected to vacuum freeze-drying to obtain the triple-layer gradient conductive carbon nanotube foam with a thickness of 4 mm.

(S2) Pre-Treatment of a Hexagonal Boron Nitride

Hexagonal boron nitride particles were ball-milled for 24 h to reduce the number of layers and a sheet size to obtain the hexagonal boron nitride with an average sheet size of 1 μm.

(S3) Preparation of a Silicone Rubber/Hexagonal Boron Nitride Mixture 1 g of the hexagonal boron nitride prepared in step (S2) and 4.5 g of DMS were blended, ultrasonically dispersed, stirred for 10 min, added with 4.5 g of the curing agent, stirred for another 5 min and deaerated in a vacuum oven for 10 min to obtain the uniformly dispersed PDMS/hexagonal boron nitride mixture, where the weight ratio of the silicone rubber to the curing agent was 1:1.

(S4) Preparation of a Gradient Electrically Conductive-Uniform Thermally Conductive Dual Network Structure-Based Electromagnetic Shielding Polymer Composite with Low Reflection and High Absorption The PDMS/hexagonal boron nitride mixture prepared in step (S3) was poured into the mould containing the triple-layer gradient conductive carbon nanotube foam prepared in step (S1) by the vacuum potting and filled into the carbon nanotube foam under vacuum to obtain a crude composite. After that, the crude composite was cured at 80° C. for 2 h to obtain the gradient electrically conductive-uniform thermally conductive dual network structure-based electromagnetic shielding polymer composite with low reflection and high absorption.

EXAMPLE 3

Provided herein was a method for preparing a triple-layer carbon nanotube-based electromagnetic shielding polymer composite with a gradient electrically conductive-uniform thermally conductive dual-functional network structure, which was specifically described as follows.

(S1) Preparation of a Triple-Layer Gradient Conductive Carbon Nanotube Foam 40 mg of a carbon nanotube and 0.46 g of a waterborne polyurethane (with a solid content of 35 wt %) were blended in 10 mL of deionized water and then ultrasonically dispersed for 30 min to obtain a CNT-20 dispersion. 60 mg of the carbon nanotube and 0.4 g of the waterborne polyurethane were blended in 10 mL of deionized water and ultrasonically dispersed for 30 min to obtain a CNT-30 dispersion. 80 mg of the carbon nanotube and 0.34 g of the waterborne polyurethane were blended in 10 mL of deionized water and ultrasonically dispersed for 30 min to obtain a CNT-40 dispersion. The CNT-20 dispersion, the CNT-30 dispersion and the CNT-40 dispersion were poured into a mould in sequence, and freeze-shaped in liquid nitrogen, treated by heat flow to eliminate an interface between layers to make the cells communicated, and then subjected to vacuum freeze-drying to obtain the triple-layer gradient conductive carbon nanotube foam with a thickness of 4 mm.

(S2) Pre-Treatment of a Hexagonal Boron Nitride

Hexagonal boron nitride particles were ball-milled for 24 h to reduce the number of layers and a sheet size to obtain the hexagonal boron nitride with an average sheet size of 1 µm.

(S3) Preparation of a Silicone Rubber/Hexagonal Boron Nitride Mixture 2 g of the hexagonal boron nitride prepared in step (S2) and 4 g of the silicone rubber PDMS were blended, ultrasonically dispersed, stirred for 10 min, added with 4 g of the curing agent, stirred for another 5 min and deaerated in a vacuum oven for 10 min to obtain the uniformly dispersed PDMS/hexagonal boron nitride mixture, where the weight ratio of the silicone rubber to the curing agent was 1:1.

(S4) Preparation of a gradient electrically conductive-uniform thermally conductive dual network structure-based electromagnetic shielding polymer composite with low reflection and a high absorption. The PDMS/hexagonal boron nitride mixture prepared in step (S3) was poured into the mould containing the triple-layer gradient conductive carbon nanotube foam prepared in step (S1) by the vacuum potting and filled into the carbon nanotube foam under vacuum to obtain a crude composite. After that, the crude composite was cured at 80° C. for 2 h to obtain the gradient electrically conductive-uniform thermally conductive dual network structure-based electromagnetic shielding polymer composite material with low reflection and high absorption.

Comparative Example 1

Provided herein was a preparation of the pure silicone rubber PDMS, which was specifically described as follows.

5 g of the silicone rubber PDMS and 5 g of a curing agent were blended, stirred for 5 min, dispersed uniformly followed by poured into a mould and deaerated in a vacuum oven for 10 min to obtain the pure PDMS with a thickness of 4 mm, where a weight ratio of the silicone rubber to the curing agent was 1:1.

Comparative Example 2

Provided herein was a preparation of the PDMS/hexagonal boron nitride thermal conductive composite, which was specifically described as follows.

(S1) Pre-Treatment of a Hexagonal Boron Nitride

Hexagonal boron nitride particles were ball-milled for 24 h to reduce the number of layers and a sheet size to obtain the hexagonal boron nitride with an average sheet size of 1 µm.

(S2) Preparation of the Silicone Rubber/Hexagonal Boron Nitride Thermal Conductive Composite 1 g of the hexagonal boron nitride prepared in step (Si) and 4.5 g of the silicone rubber PDMS were blended, ultrasonically dispersed, stirred for 10 min, added with 4.5 g of the curing agent, stirred for another 5 min, dispersed uniformly followed by poured into a mould and deaerated in a vacuum oven for 10 min to obtain the PDMS/hexagonal boron nitride thermal conductive composite with a thickness of 4 mm, where the weight ratio of the silicone rubber to the curing agent was 1:1.

Comparative Example 3

Provided herein was a method for preparing a carbon nanotube-based electromagnetic shielding polymer composite with a uniform conductive-uniform thermally conductive dual network structure, which was specifically described as follows.

(S1) Preparation of a Uniformly Conductive Carbon Nanotube Foam 180 mg of a carbon nanotube and 1.2 g of a water-based polyurethane (with a solid content of 35wt %) were blended in 30 mL of deionized water, ultrasonically dispersed for 30 min to obtain a CNT-30 dispersion. The CNT-30 dispersion was poured into a mould, freeze-shaped in liquid nitrogen, and then subjected to vacuum freeze-drying to obtain the uniformly conductive carbon nanotube foam with a thickness of 4 mm.

(S2) Pre-Treatment of a Hexagonal Boron Nitride

Hexagonal boron nitride particles were ball-milled for 24 h to reduce the number of layers and a sheet size to obtain the hexagonal boron nitride with an average sheet size of 1 µm.

(S3) Preparation of a Silicone Rubber/Hexagonal Boron Nitride Mixture 1 g of the hexagonal boron nitride prepared in step (S2) and 4.5 g of PDMS were blended, ultrasonically dispersed, stirred for 10 min, added with 4.5 g of the curing agent, stirred for another 5 min and deaerated in a vacuum oven for 10 min to obtain the uniformly dispersed PDMS/hexagonal boron nitride mixture, where the weight ratio of the silicone rubber to the curing agent was 1:1.

(S4) Preparation of a uniformly conductive-uniformly thermal conductive dual network structure-based electromagnetic shielding polymer composite material with low reflection and high absorption The PDMS/hexagonal boron nitride mixture prepared in step (S3) was poured into the mould containing the uniformly conductive carbon nanotube foam prepared in step (S1) by the vacuum potting and filled into the carbon nanotube foam under vacuum to obtain a crude composite. After that, the crude composite was cured at 80° C. for 2 h to obtain the uniformly conductive-uniform thermally conductive dual network structure-based electromagnetic shielding polymer composite material with low reflection and high absorption.

TABLE 1

Electromagnetic shielding performance, reflection coefficient and thermal conductivity of composite materials prepared in Examples 1-3

| Item | Carbon nanotube foam filler content (wt %) | Carbon nanotube foam filler content of each layer (wt %) | Boron nitride filler content (wt %) | X-band average electromagnetic shielding effectiveness (dB) | Reflection coefficient (R) | Thermal conductivity (W · m$^{-1}$K$^{-1}$) |
|---|---|---|---|---|---|---|
| Comparative example 1 | 0 | 0 | 0 | 1.9 | 0.05 | 0.18 |
| Comparative example 2 | 0 | 0 | 10 | 2.7 | 0.17 | 0.39 |
| Comparative example 3 | 30 | 30 | 10 | 20.9 | 0.42 | 0.41 |
| Example 1 | 30 | 20-40 | 10 | 29.8 | 0.16 | 0.40 |
| Example 2 | 30 | 20-30-40 | 10 | 35.7 | 0.12 | 0.40 |
| Example 3 | 30 | 20-30-40 | 20 | 39.0 | 0.10 | 0.77 |

It can be seen from Table 1 that compared with the carbon nanotube-based electromagnetic shielding polymer composite prepared in Comparative Example 3, the carbon nanotube-based electromagnetic shielding polymer composite with the gradient electrically conductive-uniform thermally conductive dual network structure in Examples 1-3 have higher electromagnetic shielding effectiveness in the X-band due to the introduction of a gradient structure in the case of the same carbon nanotube load, and in the presence of a triple-layer structure, the electromagnetic shielding effectiveness reaches 35.7 dB. At the same time, the reflection coefficient of the composite gradually decreases with the introduction of the gradient structure, realizing the low reflection and the high absorption. The thermal conductivity of the composite has been significantly improved with the addition of the thermal conductive boron nitride filler. The carbon nanotube-based electromagnetic shielding polymer composite with the gradient conductivity and the uniform thermal conductivity obtained by the preparation method of the present disclosure has higher shielding effectiveness, lower reflection coefficient and excellent thermal conductivity and realizes the simultaneous optimization of the reflection and absorption to the electromagnetic wave and thermal conductivity of the electromagnetic shielding polymer composite.

FIG. 1 is an SEM image of a cross-section of a gradient conductive carbon nanotube foam. From top to bottom are the CNT-40 layer, the CNT-30 layer and the CNT-20 layer, respectively. The total content of the carbon nanotube is equivalent to a uniform structure of a CNT-30 foam. On the right is a partially enlarged view of the three-layer foam. It can be seen from FIG. 1 that the arrangement of the carbon nanotube becomes denser from a CNT-20 foam to a CNT-40 foam. In the present disclosure, the heat flow-assisted liquid nitrogen freezing makes the cells between the three foam layers communicated, and the connection-oriented cells form a path for a filling of the hexagonal boron nitride, making it easier to form a heat conduction path inside the composite material.

Figure 2:
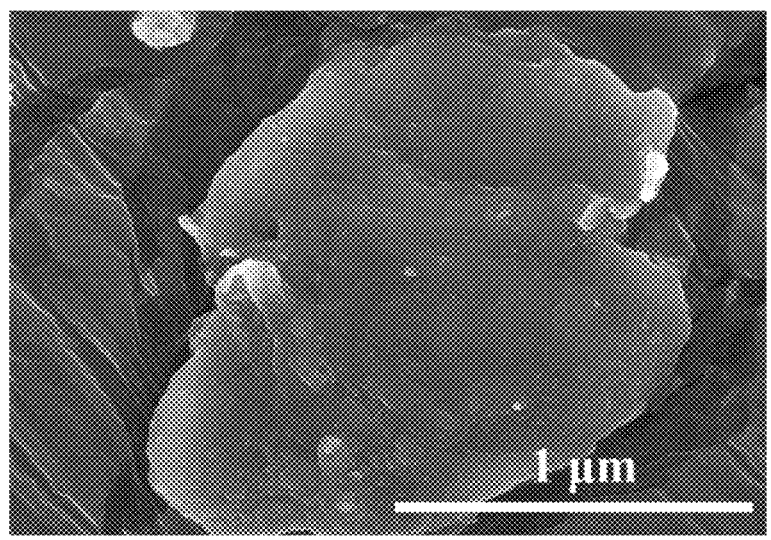
FIG. 2 is an SEM image of ball-milled hexagonal boron nitride particles.

It can be seen from FIG. 2 that the average sheet size of the ball-milled hexagonal boron nitride is about 1 μm to ensure the complete potting of the composite.

Figure 3:
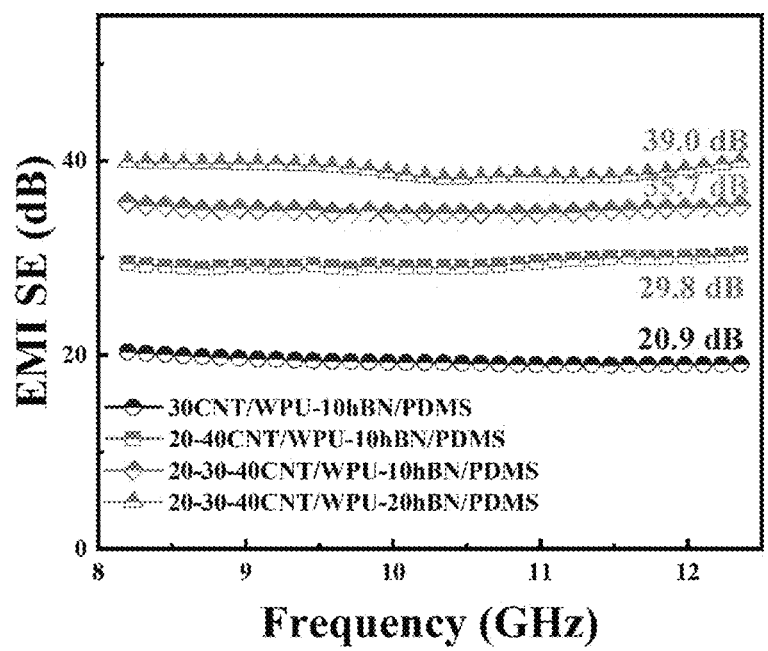
FIG. 3 shows the electromagnetic shielding performance test results of a gradient electrically conductive-uniform thermally conductive dual network structure-based electromagnetic shielding polymer composite prepared in different embodiments of the present disclosure and a uniformly electrically conductive-uniformly thermal conductive dual network structure-based electromagnetic shielding polymer composite prepared in Comparative Example 3.
Figure 4:
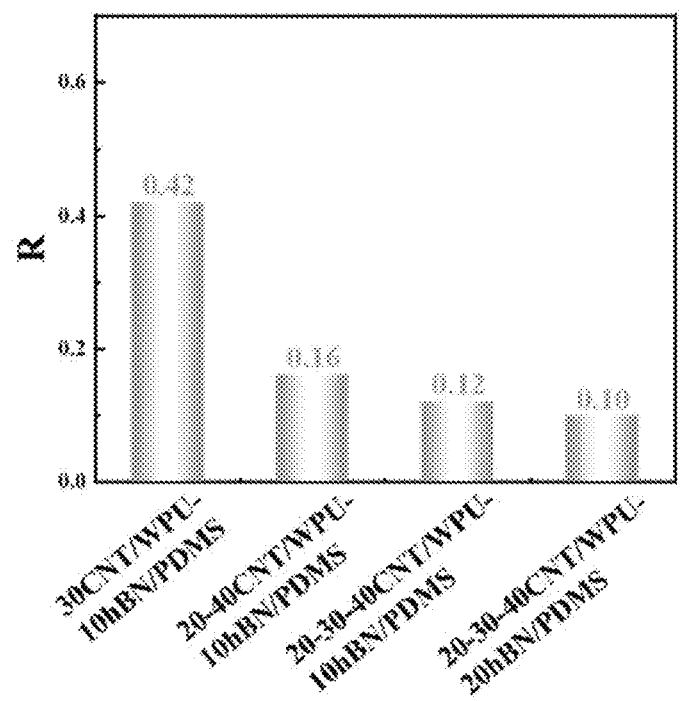
FIG. 4 shows a reflectivity of the gradient electrically conductive-uniformly thermal conductive dual network structure-based electromagnetic shielding polymer composite prepared in different embodiments of the present disclosure and the uniformly electrically conductive-uniformly thermal conductive dual network structure-based electromagnetic shielding polymer composite prepared in Comparative Example 3.

It can be seen from FIG. 3 and FIG. 4 that the design of the gradient conductive network structure significantly improves the electromagnetic shielding effectiveness of the composite and dramatically reduces the shielding reflection coefficient of the composite, which makes the electromagnetic wave lost in the composite to avoid the secondary pollution, obtaining the electromagnetic shielding composite with low reflection and high absorption.

Figure 5:
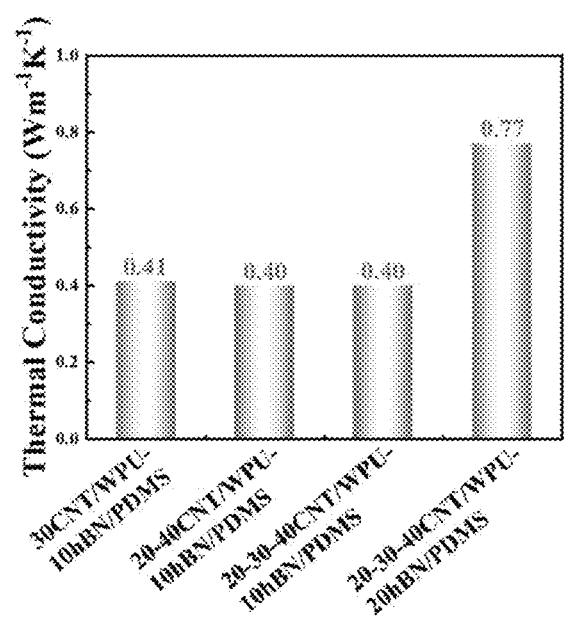
FIG. 5 shows the test results of thermal conductivity of the gradient electrically conductive-uniformly thermal conductive dual network structure-based electromagnetic shielding polymer composite prepared in different embodiments of the present disclosure and the uniformly electrically conductive-uniformly thermal conductive dual network structure-based electromagnetic shielding polymer composite prepared in Comparative Example 3.

It can be seen from FIG. 5 that the hexagonal boron nitride and the silicone rubber are blended and poured into the oriented cells, which can significantly improve the thermal conductivity of the composite. The thermal conductivity of the composite increases steadily as the content of the hexagonal boron nitride increases. It can be seen from FIGS. 3-4 that a successful combination of the hexagonal boron nitride and the gradient carbon nanotube network did not affect the stability of the conductive network. On the contrary, introducing the insulating and thermally conductive boron nitride brings more electronic polarization interfaces, which are conducive to the attenuation of the electromagnetic wave. In addition, the vertically oriented carbon nanotube network can be used as a good carrier for phonon transmission inside the composite, thereby cooperating with the high thermal conductivity boron nitride filler to conduct phonon conduction and simultaneously optimizing the thermal conductivity of the composite. Therefore, the composite prepared herein with the triple-layer gradient conductive network structure and 20% by weight of the hexagonal boron nitride achieves the optimal electromagnetic shielding effectiveness, reflection coefficient and thermal conductivity, respectively 39 dB, 0.1 and 0.77 W·m$^{-1}$K$^{-1}$.

Described above are only preferred embodiments of the present disclosure and are not intended to limit the present disclosure. It should be understood that any modifications, replacements and improvements made by those skilled in the art without departing from the spirit and scope of the present disclosure should fall within the scope of the present disclosure defined by the appended claims.

What is claimed is:

1. An electromagnetic shielding polymer composite based on a gradient electrically conductive-uniform thermally conductive dual network structure, comprising:
   a gradient electrically conductive carbon nanotube network with a vertically oriented cell structure; and
   a uniform thermally conductive hexagonal boron nitride/carbon nanotube network constructed by a hexagonal boron nitride dispersed uniformly in the carbon nanotube network and the gradient carbon nanotube network;

wherein the gradient electrically conductive carbon nanotube network and the uniform thermally conductive hexagonal boron nitride/carbon nanotube network form a composite synergistic dual function network structure.

2. A method for preparing the electromagnetic shielding polymer composite of claim 1, comprising:
(S1) blending different portions of a carbon nanotube respectively with a waterborne polyurethane in deionized water followed by ultrasonic dispersion to obtain multiple dispersions with different carbon nanotube contents; and
pouring the multiple dispersions with different carbon nanotube contents into a mould in an order of carbon nanotube content from large to small or from small to large, followed by freeze shaping in liquid nitrogen and heat flow-assisted interface elimination to make cells communicated to obtain a multi-layer conductive carbon nanotube foam;
(S2) subjecting hexagonal boron nitride particles to ball milling to reduce the number of layers and a sheet size to obtain a hexagonal boron nitride with a desired average sheet size;
(S3) mixing the hexagonal boron nitride prepared in step (S2) with a silicone rubber followed by ultrasonic dispersion and stirring; and
adding a curing agent followed by uniform mixing and deaeration in a vacuum oven to obtain a silicone rubber/hexagonal boron nitride mixture; and
(S4) pouring the silicone rubber/hexagonal boron nitride mixture prepared in step (S3) into the mould containing the multi-layer conductive carbon nanotube foam prepared in step (S1) by vacuum potting until the silicone rubber/hexagonal boron nitride mixture is filled into the multi-layer conductive carbon nanotube foam completely to produce a crude composite; and
curing the crude composite to obtain the gradient electrically conductive-uniform thermally conductive dual network structure-based electromagnetic shielding polymer composite.

3. The method of claim 2, wherein in step (S2), the hexagonal boron nitride obtained from the ball milling has an average sheet size of 1 μm.

4. The method of claim 2, wherein in step (S3), a weight ratio of the silicone rubber to the curing agent is 1:1, and a density of the silicone rubber is 1.1 g/cm$^3$.

5. The method of claim 2, wherein in step (S4), the curing is performed at 80° C. for 2 h.

6. The method of claim 2, wherein in step (Si), a carbon nanotube content of the multi-layer conductive carbon nanotube foam is 10-40 wt %.

7. The method of claim 2, wherein in step (S3), a weight ratio of the hexagonal boron nitride to the silicone rubber is (2-5):10.

8. The method of claim 2, wherein the gradient electrically conductive-uniformly thermally conductive electromagnetic shielding polymer composite comprises 10%-20% by weight of the hexagonal boron nitride and 4.8%-5.7% by weight of the multi-layer conductive carbon nanotube foam.

9. The method of claim 2, wherein in step (S1), the waterborne polyurethane has a density of 0.95 g/cm$^3$ and a solid content of 35%.

* * * * *